(12) United States Patent
Van Den Brink et al.

(10) Patent No.: US 7,714,576 B2
(45) Date of Patent: May 11, 2010

(54) AUTOMATIC SELECTION OF A RECEIVER ELEMENT IN AN MRI APPARATUS

(75) Inventors: Johan Samuel Van Den Brink, Eindhoven (NL); Tatiana Borisovna Sazonova, St. Petersburg (RU)

(73) Assignee: Koninklijke Philips Electronics N.V., Eindhoven (NL)

( * ) Notice: Subject to any disclaimer, the term of this patent is extended or adjusted under 35 U.S.C. 154(b) by 374 days.

(21) Appl. No.: 11/573,019

(22) PCT Filed: Jul. 21, 2005

(86) PCT No.: PCT/IB2005/052458

§ 371 (c)(1),
(2), (4) Date: Jan. 31, 2007

(87) PCT Pub. No.: WO2006/016292

PCT Pub. Date: Feb. 16, 2006

(65) Prior Publication Data

US 2008/0303519 A1    Dec. 11, 2008

(30) Foreign Application Priority Data

Aug. 5, 2004  (EP) .................................. 04103767

(51) Int. Cl.
*G01V 3/00* (2006.01)
(52) U.S. Cl. ........................ 324/318; 324/309
(58) Field of Classification Search ................. 324/318, 324/309; 600/410
See application file for complete search history.

(56) References Cited

U.S. PATENT DOCUMENTS 4,629,989 A  12/1986  Riehl et al.
5,138,260 A  8/1992  Molyneaux et al.

(Continued)

FOREIGN PATENT DOCUMENTS

EP    0 487 201 A1    5/1992

OTHER PUBLICATIONS

Milano, C., et al.; A Quantum Leap in MR Tomography; 2005; www.medical.siemens.com.

(Continued)

*Primary Examiner*—Louis M Arana

(57) ABSTRACT

The magnetic resonance apparatus comprises a carrier (8) to position an object (7), notably a patient to be imaged in an imaging volume V, first magnet system (2), a second magnet system (3), a power supply unit (4), an RF transmitter and modulator (6), an RF transmitter coil (5), a plurality of receiver elements (18, 19), a transmitter-receiver circuit (9), a signal amplifier and demodulation unit (10), a processing unit (12), an image processing unit (13), a monitor (14), and a control unit (11). The gradient coils (3) are fed by the power supply unit (4). The RF transmitter coil (5) serves to generate RF magnetic fields and is connected to the RF transmitter and modulator (6). The transmitter coil (5) is connected to the signal amplifier and demodulator unit (10) via the transmitter-receiver circuit (9). Receiver elements (18, 19), positioned at their respective locations L1, L2 on the carrier (8), are arranged to detect a response of the object to the RF magnetic fields. The control unit (11) controls the RF transmitter and modulator (6), the power supply unit (4) and automatically selects suitable receiver elements (18, 19) to detect the response of the object (7) to the magnetic resonance excitation.

10 Claims, 5 Drawing Sheets

U.S. PATENT DOCUMENTS

Figure 1:
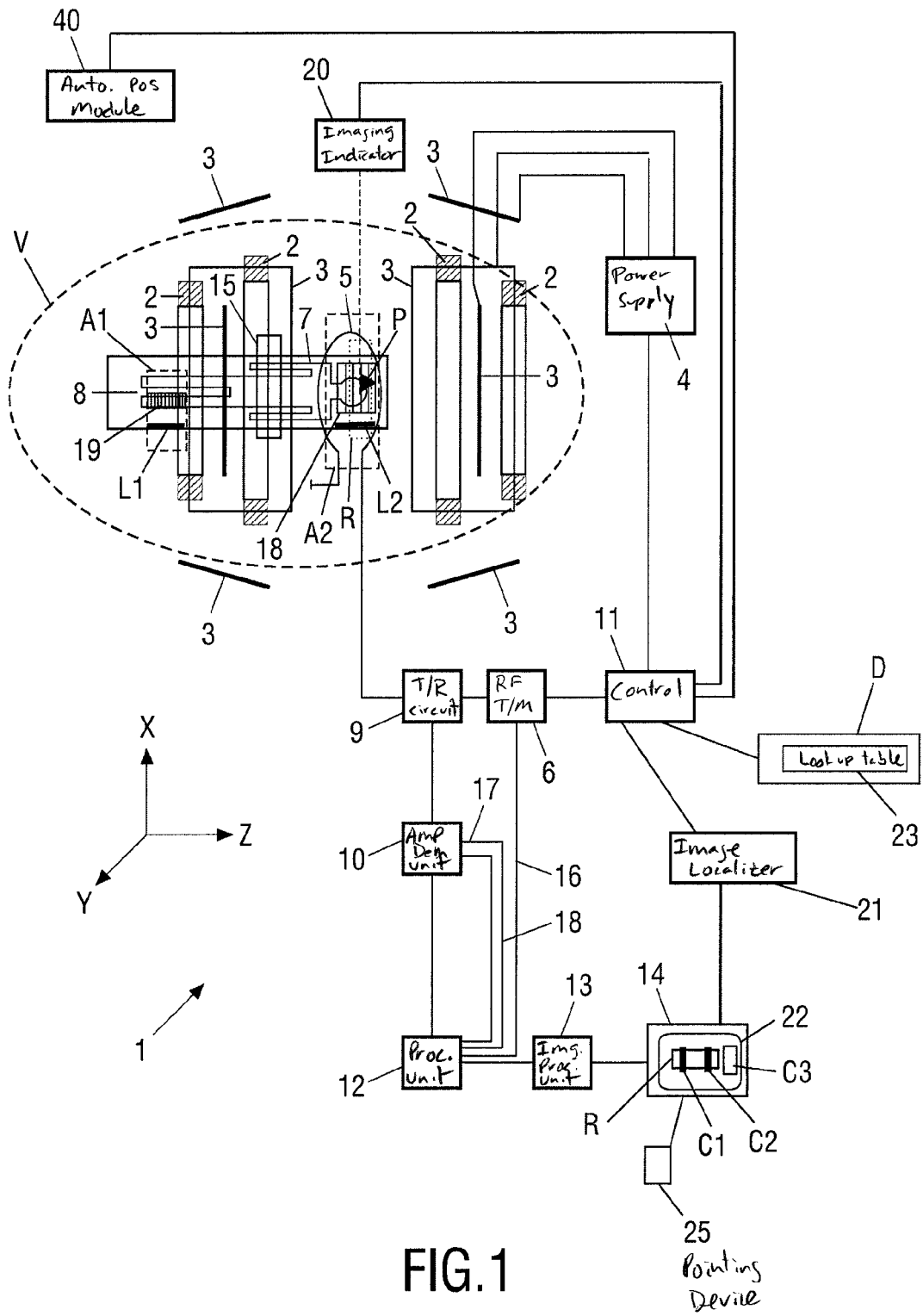

| | | |
|---|---|---|
| 5,551,430 A | 9/1996 | Blakeley et al. |
| 5,584,293 A * | 12/1996 | Darrow et al. ............... 600/410 |
| 6,134,465 A | 10/2000 | Frederick et al. |
| 6,223,065 B1 | 4/2001 | Misic et al. |
| 6,253,101 B1 | 6/2001 | Seng et al. |
| 6,492,814 B1 | 12/2002 | Watkins et al. |
| 6,724,923 B2 | 4/2004 | Ma et al. |
| 7,259,559 B2 * | 8/2007 | Nabetani et al. ............ 324/309 |
| 2002/0021128 A1 | 2/2002 | Kuhara |
| 2003/0184292 A1 | 10/2003 | Meyer et al. |

OTHER PUBLICATIONS

Milano, C., et al.; Introducing MAGNETOM Avanto: The Revolution Begins Now; 2003; Medical Solutions Online; vol. 1, pp. 16-19.

* cited by examiner

AUTOMATIC SELECTION OF A RECEIVER ELEMENT IN AN MRI APPARATUS

The invention relates to a magnetic resonance imaging apparatus arranged to acquire a signal representative of a response of an object to an excitation pulse when said object is positioned in an imaging volume of the magnetic resonance imaging apparatus, whereby said apparatus is further arranged to automatically select a receiver element for purposes of said acquisition, said apparatus comprising:
- a carrier arranged to position the object in the imaging volume;
- a plurality of receiver elements arranged to cover respective regions on the object, said receiver elements having established respective dimensions and locations in the magnetic resonance imaging apparatus.

The invention further relates to a method for automatically selecting a receiver element in a magnetic resonance imaging apparatus, comprising the steps of:
- providing a carrier conceived to position an object to be imaged in an imaging volume of the apparatus;
- positioning a plurality of receiver elements on the object, said receiver elements having established respective dimensions and locations in the magnetic resonance imaging apparatus.

The invention still further relates to a computer program for automatically selecting a receiver element from a plurality of receiver elements positioned on an object conceived to be imaged in a magnetic resonance imaging apparatus.

An embodiment of a magnetic resonance apparatus as is set forth in the opening paragraph is known from U.S. Pat. No. 6,223,065 (B1). The known magnetic resonance imaging apparatus is arranged to enable a selection of a suitable receiver coil within a coil array positioned on a patient conceived to be imaged in an imaging volume of the known magnetic resonance imaging apparatus. The coils constituting the coil array are selected to image a region of interest within the patient according to established locations of the coil elements relative to an iso-center of the magnetic resonance imaging apparatus. For this purpose in the known arrangement the coil array is provided with a sensor having a known position with respect to the coil array, said sensor being arranged to provide a signal representative of a local value of the magnetic field of the known magnetic resonance apparatus, for example based on the gradient magnetic pulses provided by a gradient field coil. In order to perform sensing of the selectively applied magnetic gradient fields of the known magnetic resonance imaging apparatus, shielded Z-axis gradient field sensors are disposed at each end of the sensor. The signal in the sensor is thus directly proportional to a displacement of the sensor with respect to the iso-center of the known magnetic resonance imaging apparatus. The coil elements constituting the array have predetermined locations with respect to the sensor and their actual position is deduced from the position information provided by the sensor. The selection of appropriate coils elements for imaging the region of interest is determined from a comparison of the position of the region of interest and the actual positions of the coils elements within the array.

It is a disadvantage of the known magnetic resonance imaging apparatus that for purposes of coil selection a magnetic resonance imaging step has to be carried out, enabling a determination of the position of the receiver coil array from the gradient field.

It is an object of the invention to provide a magnetic resonance imaging apparatus whereby the selection of the receiver element is automatically enabled in a simple and a reliable way.

To this end, the magnetic resonance imaging apparatus according to the invention further comprises:
- an imaging indicator arranged to define a position of a reference point for the object on the carrier, said reference point being indicative of a region of interest;
- an imaging localizer arranged to determine a position and a dimension of the region of interest with respect to the reference point;
- a control unit arranged to establish a further position and a further dimension of the region of interest on the carrier from
  - the position of the reference point and
  - said position and the dimension of the region of interest and
- to select a receiver element from said plurality of receiver elements based on the further position and the further dimension of the region of interest on the carrier and the respective dimensions and locations of the receiver elements in the magnetic resonance imaging apparatus.

The technical measure of the invention is based on the insight that it is possible to fully automate the procedure of a selection of a suitable receiver element, notably a receiver coil, provided the position of the receiver element and the position of the region of interest have been well defined with respect to a common reference coordinate system of the magnetic resonance imaging apparatus, for example as a result of a suitable calibration step at system installation or prior to the imaging procedure. The carrier, notably a displaceable carrier, such as a patient support table, provides suitable means for a definition of a common reference coordinate system. It is envisaged that the respective locations of the receiver elements with respect to the magnetic resonance imaging apparatus, notably the carrier, or the magnet, are known by design. Preferably, the reference is made either to the magnet frame of reference or to a frame of reference of the carrier. It is noted that in a common configuration, the receiver elements, notably the coils, are attachable to the carrier, and are displaceable with it, which necessitates a determination of their location in the magnetic resonance imaging apparatus for each new set-up. Alternatively, it is possible that some receiver elements, for example phased-array coils, are mounted in a magnet bore and do not change their location. In this case it suffices to establish the respective locations of such coils and coordinates of the coil elements constituting the phased-array once, and to store corresponding data in an accessible file. For example, a look-up table may be a-priori prepared corresponding to different receiver elements, such as different coils and different coil configurations being used in the magnetic imaging apparatus. Preferably, the look-up table also comprises respective dimensions of the coils, preferably specified as respective coordinates of coil elements with respect to an a-priori established respective suitable origins, like an origin of a receiver coil. The look-up table is preferably stored in a suitable file and is accessible by the control unit. Alternatively, the respective locations of the receiver elements may be established from a suitable magnetic resonance scan by matching sensitivity patterns to an a-priori knowledge of respective topologies of the receiver element, being, for example, a receiver coil. In case the receiver element comprises a stationary element, for example a posterior portion being mounted in a magnet bore, and a displaceable element, for example an anterior portion, attached to the carrier, the location of only the anterior portion has to be established. Next, the region of interest conceived to be imaged is referenced with respect to the carrier as well. This is advantageously facilitated by a standard light visor action, seeding a reference point on the object, which position with respect to the carrier is automatically established by the functionality of the contemporary magnetic resonance imaging apparatuses. Although it is a common practice to position the light visor inside the envisaged region of interest, it is also possible to position the reference point somewhere on the patient or on the carrier and to store the distance between the reference point and the envisaged region of interest. The geometry of the region of interest is determined by the imaging localizer which is arranged to set the RF pulse's frequency offset and bandwidth in combination with the magnetic field gradient strength with respect to the reference point. Preferably, the imaging localizer is arranged to automatically assign the dimension of the region of interest based on a suitable imaging template. Alternatively, the dimension of the region of interest can be established by an operator using a suitable survey scan. Still alternatively the dimension of the region of interest may be a-priori set, for example in an imaging template. In this case the position and the dimension of the region of interest is determined by reading a suitable file corresponding to the imaging template. Therefore, also the position and the dimension of the region of interest can be automatically established. Usually this is carried out in the patient frame of reference. In the magnetic resonance imaging apparatus according to the invention, the control unit is provided to establish the further position and the further dimension of the region of interest with respect to a frame of reference of the carrier. In this way the region of interest and the receiver elements are reference in the common frame of reference, for example the system frame of reference. The control unit then selects the suitable receiver element from the thus established further position and further dimension of the region of interest and the established respective locations and dimensions of the receiver coils of the plurality of the receiver elements arranged in the magnetic resonance apparatus around the object.

It is noted that the term receiver element refers either to an RF-antenna, susceptible to magnetic resonance signals, or to a coil element within a coil array, or to a physically separated receiver coil configuration, like a head coil, or an extremity coil, etc. For the latter case it is preferable that the receiver coil configuration has a pre-determined repetitively used dwell locations on the carrier, so that the look-up table does not have to be updated for different locations of the same receiver coil configuration on the carrier.

According to the technical measure of the invention, the position of each receiver element within the plurality of the receiver elements positioned on the object is reduced to a vector calculus, which is easy to solve. Preferably, the corresponding calculation is parameterized, for example with respect to the position of the region of interest, the sensitivity volume of the receiver element, notably a coil or a coil element, and considerations concerning a loss of a signal-to-noise ratio due to acquiring MR signals with coils far away from the region of interest. The control unit then performs this parameterized calculation and instantly determines a necessary selection of receiver elements upon an event the position and size of the region of interest on the carrier is obtained. As follows from the foregoing, neither any substantial user interaction is required for establishing the suitable selection of the receiver element, nor is any magnetic resonance imaging necessary. Therefore, the overall work-flow of the magnetic resonance imaging is improved.

Preferably, in the magnetic resonance imaging apparatus according to the invention, the location of the receiver elements relative to the magnetic resonance imaging apparatus, notably the carrier or the magnet, and the respective sizes of the receiver elements, notably the coils, are known by system design, and are stored in a look-up table. The relative position of the patient support relative to the magnet's iso-center is calibrated upon system installation, and stored in a look-up table. The control unit uses the data from the look up tables together with determined further position and further dimension of the region of interest relative to the carrier, in order to select the appropriate receiver elements.

Figure 5:
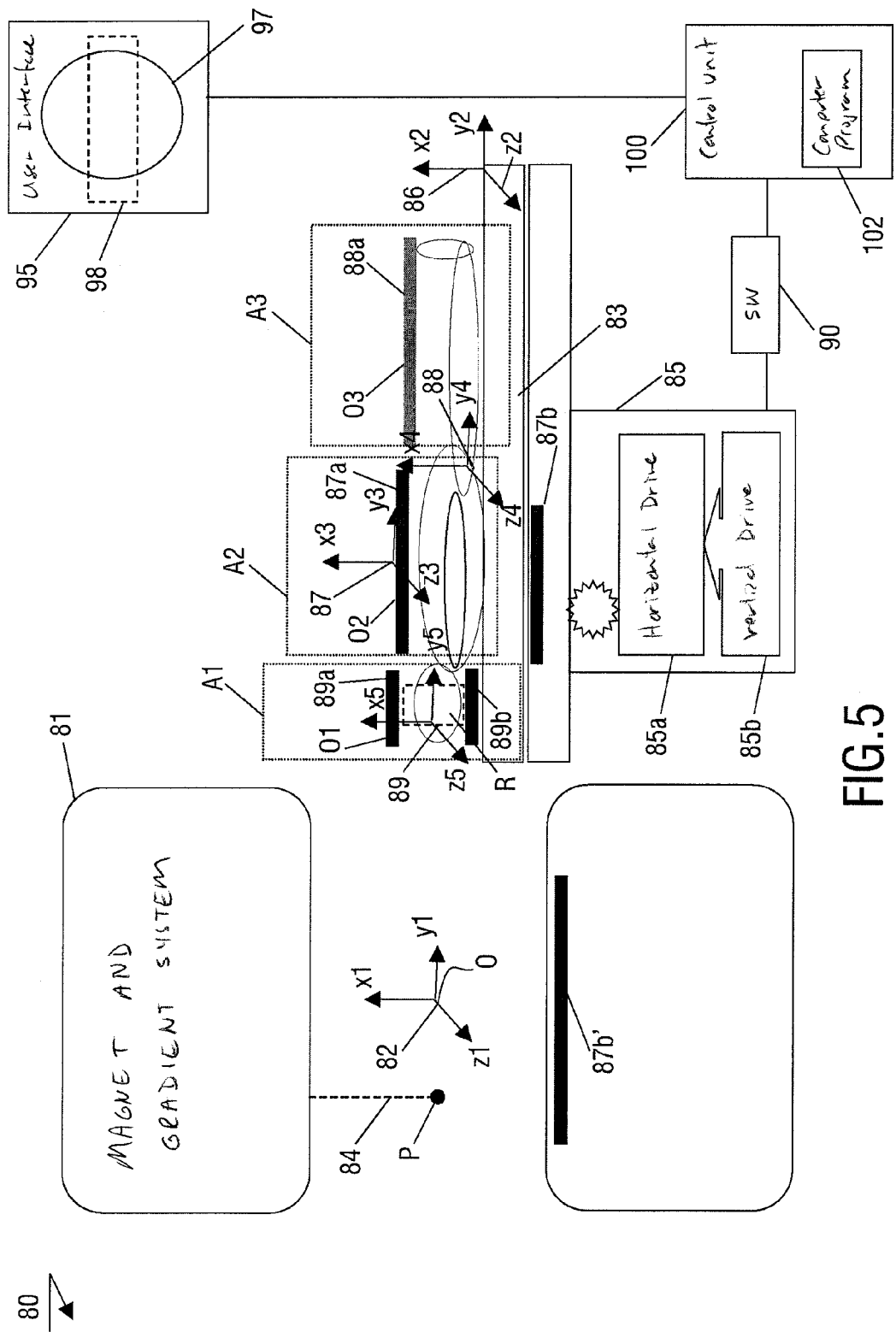

It must be understood that in the magnetic resonance apparatus several related frames of reference exist. First, the magnet and gradient system has its common frame of reference with an origin, generally referred to as the isocenter. The imaging indicator, usually implemented as light visor, has a position, which is known by design of the magnetic resonance imaging apparatus and is fixed in the magnet frame of reference. Secondly, the carrier has its own frame of reference, whose position is calibrated with respect to the frame of reference of the magnet during an installation procedure of the magnetic resonance apparatus, so that a simple transformation can be used to translate an actual position of the carrier, as measured, for example by a suitable software, into the frame of reference of the magnet. Third, a receiver element, notably a receiver coil, has its own frame of reference and its location with respect to the carrier, the position of the coil elements being usually related to a defined origin of the receiver coil. Several coil arrangements are envisaged, namely a fixed coil, whereby its position to the carrier is known by design, for example due to suitable coil fixation means present on the carrier, or, alternatively, a displaceable coil, whereby its position can be established using automatic positioning means comprising suitable mechanical measures and/or suitable wireless positioning technology. Fourth, a patient is usually assigned his own frame of reference, related, for example to the selected anatomical area conceived to be imaged by means of the magnetic resonance imaging apparatus. The position of the anatomical area is selectable by a user from a light visor action, whereby the user links the patient frame of reference to the frame of reference of the magnet. Thus, the relation between the frame of reference of the magnet and the frame of reference of the carrier and the frame of reference of the patient relates to the actual location of the carrier, whereby the transformation between the frame of reference of the carrier and the frame of reference of the receiver coil further relates the patient frame of reference to the coil location. Fifth, there is a frame of reference for the imaging region of interest within the selected anatomical area, which is defined by a suitable user interface of the magnetic resonance apparatus, yielding, for example a graphic representation of the scan location with respect to a survey scan. The frame of reference of the region of interest is thus related to patient frame of reference. The position and the dimension of the region of interest are first defined in the patient frame of reference. Thus, in order to select a suitable receiver element a simple transformation between the existing frames of references suffices, which can be solved using simple vector calculus. The result of this transformation is the further position and the further dimension of the region of interest, which is reference in the system frame of reference, for example, represented by the carrier. The respective frames of reference of a magnetic resonance imaging apparatus are schematically illustrated in FIG. 5.

In an embodiment of the magnetic resonance imaging apparatus according to the invention, the apparatus further comprises an automatic positioning module arranged to automatically establish the respective locations of the receiver elements and to forward a signal representative of locations to the control unit.

It is found particularly advantageous to provide an automatic positioning module for establishing the respective locations of the receiver elements on the carrier, several embodiments thereof being envisaged. First, it is possible to accommodate receiving portions on the carrier conceived to interact with corresponding parts of the receiver elements. This can be implemented as a mechanical lock provided with suitable electronics arranged to identify a type of the receiver elements being connected to the lock. The respective positions of the mechanical locks are determined beforehand and can be stored in a look-up table. When a plurality of receiver elements are connected to a plurality of receiving portions, the automatic positioning module instantly determines at which positions on the carrier there are respective receiver elements. The selection of the suitable receiver elements is thus further simplified. It is noted, that this embodiment is particularly advantageous for an automatic determination of respective locations of receiver coil configurations. For example, when a head coil and a knee coil are positioned on the patient, for a head scan the head coil is activated, whereby for the knee scan the knee coil is activated. It is further possible to discriminate between coil elements within the coil configuration in a similar manner, provided it is a-priori established at which coordinates the coil elements are positioned with respect to the receiving portions. Preferably, the design of the coil elements comprising an identifiable coil is stored in a look-up table with all positions and sizes of the elements relative to a fixed reference point in the coil. The known geometry of the coil is combined with information concerning the location of the coil relative to the region of interest to select the appropriate subset of coil elements.

Secondly, it is possible to establish the location of the receiver element on the carrier in real time using electronic means. Preferably a per se known positioning system is used, like a global positioning system, preferably miniaturized to scan the area of the magnetic resonance imaging apparatus, including the imaging volume. Preferably, in the magnetic resonance imaging apparatus, for example a part of housing is accommodated with a suitable number of positioning transmitters, whereby the receiver elements are accommodated with respective beacons arranged to indicate the presence of the receiver elements in space. Preferably, the beacons are actuated on demand, so that the receiver coils, being not in use, do not disturb the surrounding. When a receiver element, notably a coil, provided with a beacon is positioned on the patient, the positioning transmitters determine its location and/or a signal representative to it on the carrier. This step is preferably carried out when the carrier is extracted from the imaging volume to prevent parasite reflections inside a magnet bore or between adjacent portions of an open magnet system. The thus established locations are made available to the control unit and are used for the automatic selection of the suitable receiver coil for imaging of the region of interest. Also this embodiment is particularly advantageous for the receiver coil configurations, discriminating between different dedicated coils positioned on the patient. Also, discrimination between different coil elements within a coil array is feasible. It is noted that the current positioning technology facilitates discrimination of positioning information on a sub-centimeter range, especially when the positioning transmitters are located in a vicinity of the beacons. It must be noted that for purposes of receiver coil selection, recognition of the coil location within 5-10 cm accuracy suffices.

In a further embodiment of the magnetic resonance apparatus according to the invention, it further comprises a user interface arranged to visualize the selected receiver elements to a user. The feedback of the position of the receiver element is preferably implemented by using suitable geometry information about the receiver element from the same look-up table as that used to select the appropriate receiver element. It is found to be advantageous to feed back the coil selection to the user, who may confirm, or reject the selection. In this way the reliability and quality control of the automatic coil selection is guaranteed.

In a still further embodiment of the magnetic resonance apparatus according to the invention, the user interface is further arranged to enable an adjustment of the automatic selection of the receiver element by the user. Preferably, the user may select additional coils or coil elements and/or deselect already selected ones. This feature further improves the work-flow of the imaging procedure, enabling full user control for obtaining the desired image quality. Preferably, the resulting positions of the selected coil elements are stored together with the image. Still preferably, the system stores the schematic representation of the coil locations as a 'presentation state' together with the diagnostic images. The user can select to display the location of the used coils in reviewing the imaging results.

A method according to the invention comprises the further steps of:
defining a position of a reference point for the object on the carrier, said reference point being indicative of a region of interest;
determining a position and a dimension of the region of interest with respect to the reference point;
establishing a further position and a further dimension of the region of interest on the carrier from the position of the reference point and said position and dimension of the region of interest;
selecting a receiver element from said plurality of receiver elements based on the further position and the further dimension of the region of interest and the respective dimensions and locations of the receiver elements in the magnetic resonance imaging apparatus.

According to the method of the invention, a simple automatic procedure for a reliable selection of suitable receiver elements accommodated in a magnetic resonance apparatus is provided. Further advantageous embodiments of the method according to the invention are set forth in Claims 6, 7.

The computer program according to the invention is arranged to cause the processor to carry out the steps of:
establishing respective dimensions and locations of the plurality of receiver elements positioned on a carrier;
defining a position of a reference point for the object on the carrier, said reference point being indicative of a region of interest;
determining a dimension and a position of the region of interest with respect to the reference point;
establishing a further position and a further dimension of the region of interest on the carrier from the position of the reference point and said position and dimension of the region of interest;
selecting a receiver element from said plurality of receiver elements based on the further position and the further dimension of the region of interest and the respective dimensions and locations of the receiver elements in the magnetic resonance imaging apparatus.

These and other aspects of the invention are discussed in more details with reference to figures.

FIG. 1 presents in a schematic way an embodiment of a magnetic resonance imaging apparatus according to the invention.

Figure 2:
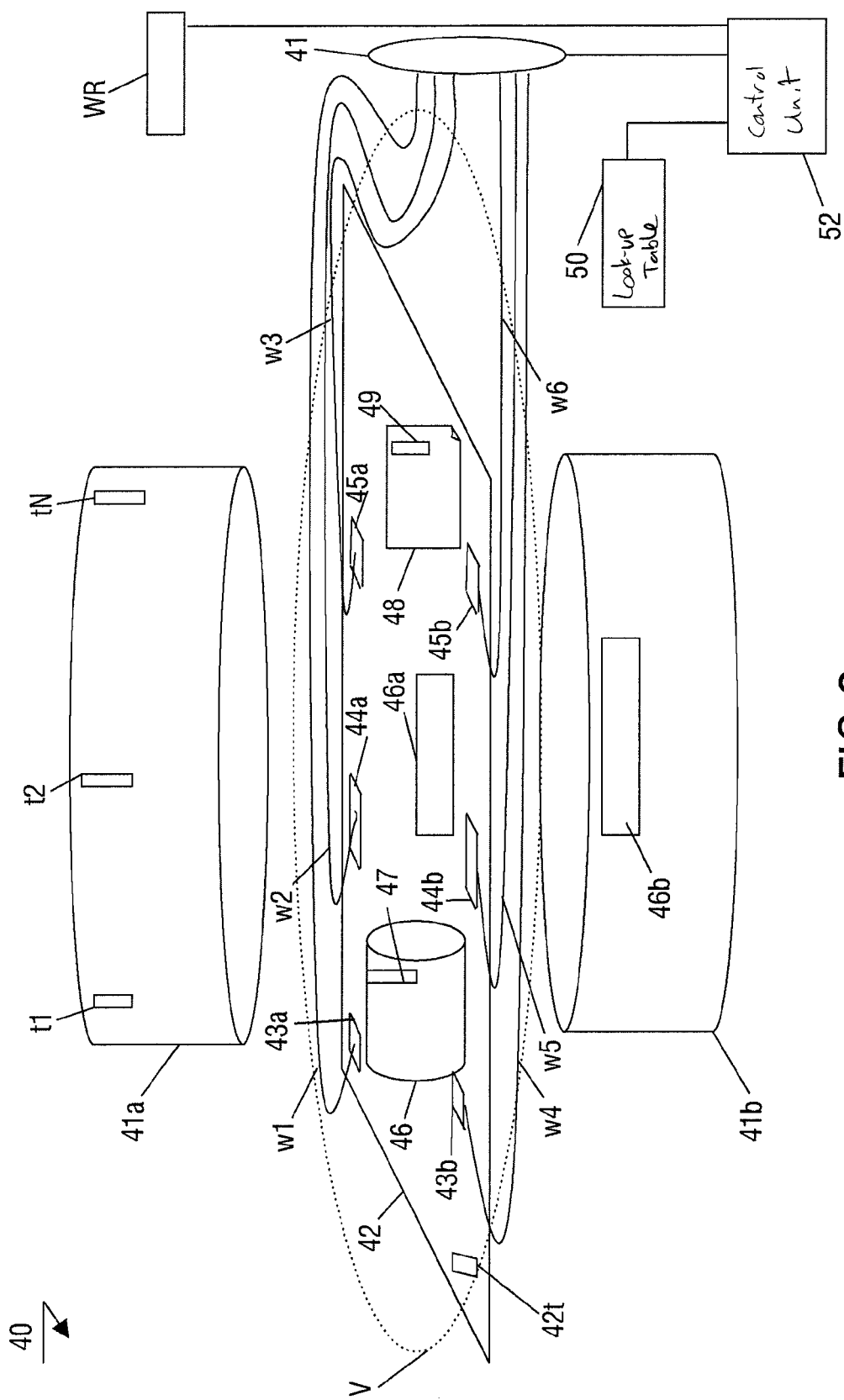

FIG. 2 presents in a schematic way an embodiment of the automatic positioning module according to the invention.

Figure 3:
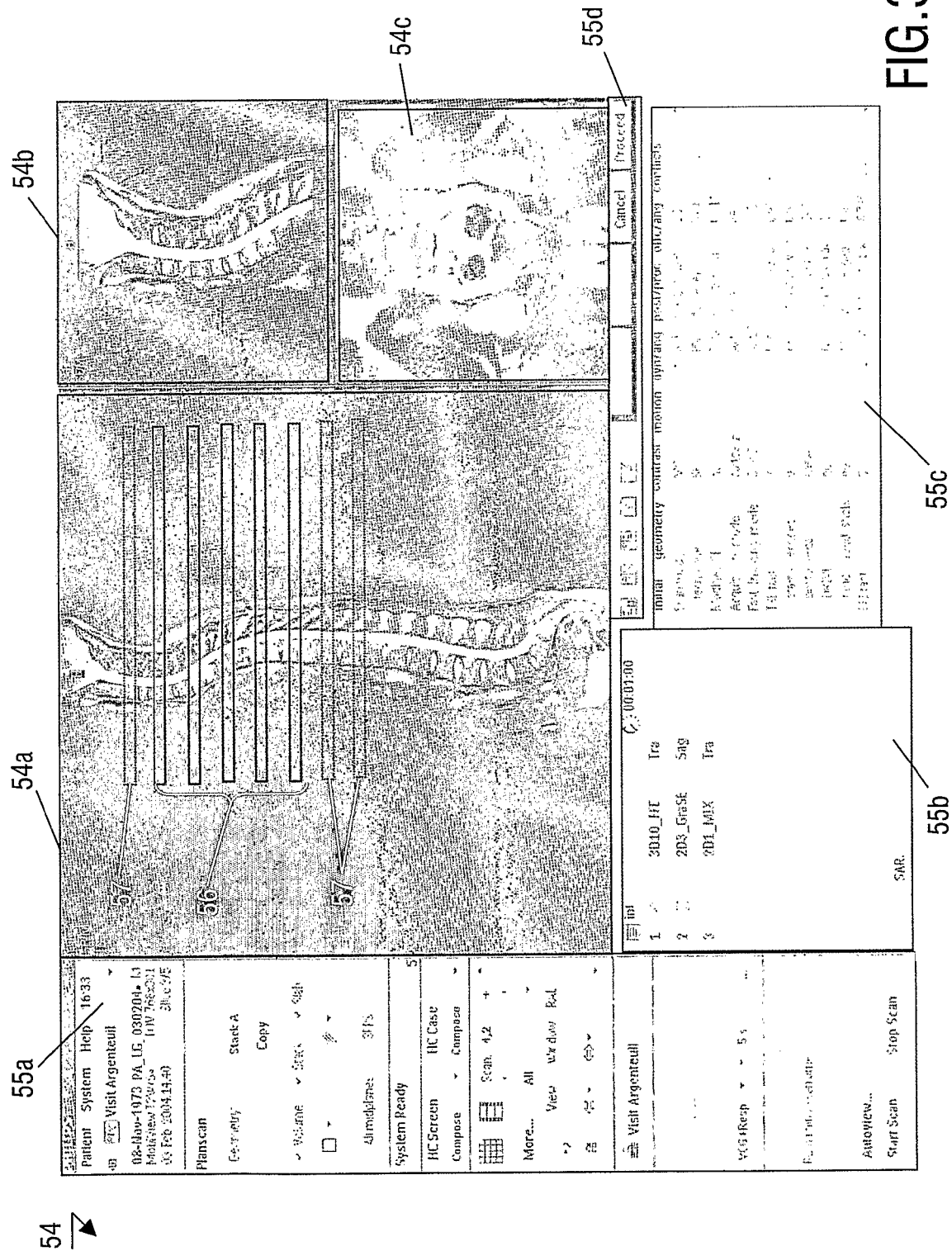

FIG. 3 presents in a schematic way an embodiment of a user interface according to the invention.

Figure 4:
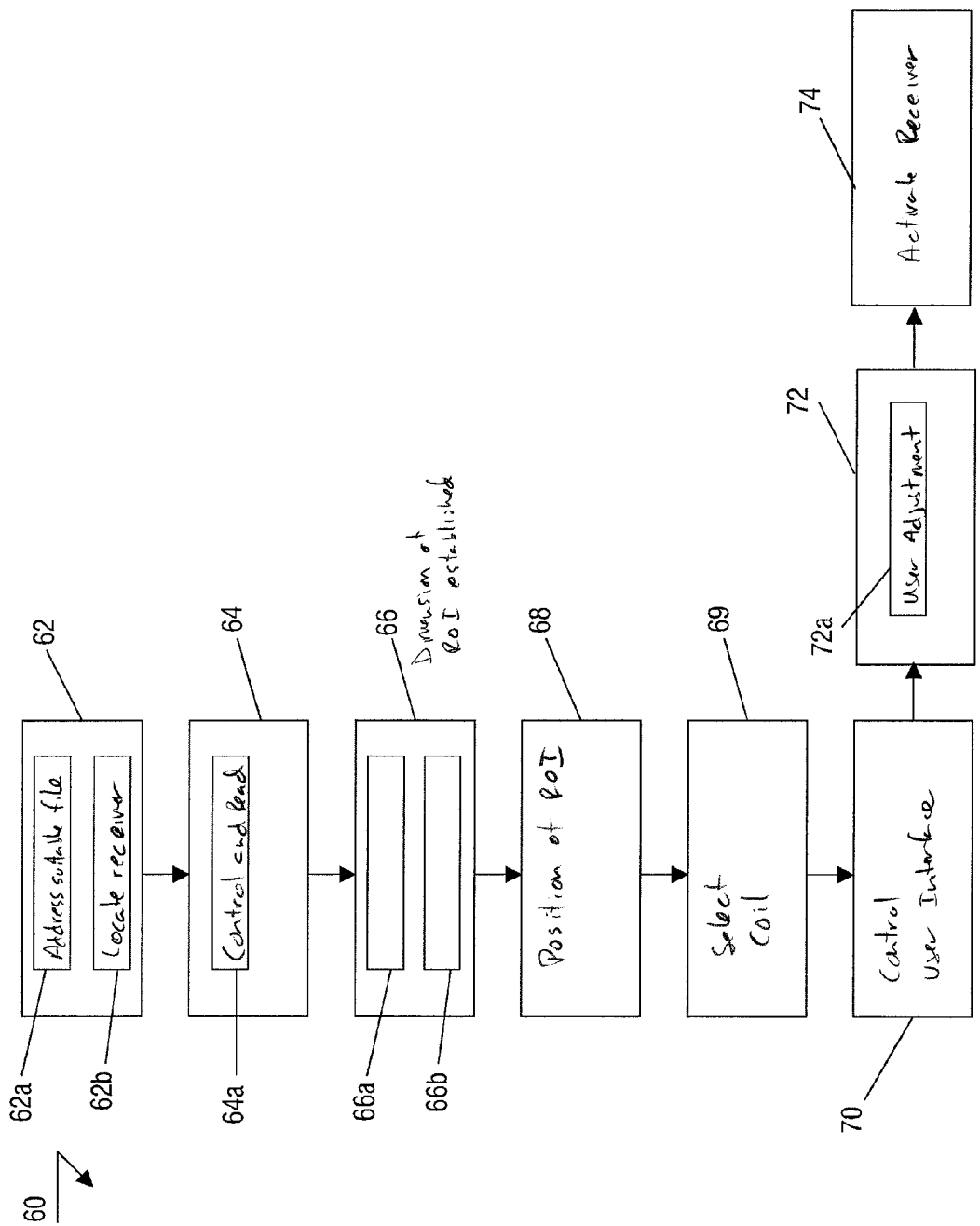

FIG. 4 presents in a schematic way a block-scheme of an operation of the computer program according to the invention.

FIG. 5 presents in a schematic way respective reference frames of relevant objects in a magnetic resonance apparatus.

FIG. 1 presents in a schematic way an embodiment of a magnetic resonance imaging apparatus according to the invention. The magnetic resonance apparatus comprises a carrier 8 to position an object 7, notably a patient to be imaged in an imaging volume V, first magnet system 2, a second magnet system 3, a power supply unit 4, an RF transmitter and modulator 6, an RF transmitter coil 5, a plurality of receiver coils 18, 19, a transmitter-receiver circuit 9, a signal amplifier and demodulation unit 10, a processing unit 12, an image processing unit 13, a monitor 14, and a control unit 11. The first magnet system 2 serves to generate a steady magnetic field in the imaging volume V. The various gradient coils of the second magnet system 3 serve to generate additional magnetic fields having a gradient in the X, Y, Z directions, respectively. The Z direction of the coordinate system shown in FIG. 1 corresponds by convention to the direction of the steady magnetic field in the magnet system 2. The measuring coordinate system x,y,z to be used may be chosen independently of the X, Y, Z system illustrated in FIG. 1. In the context of the present application gradients are to be understood to mean temporary magnetic fields which are superposed on a steady magnetic field and cause a gradient in the steady magnetic field in three respective orthogonal directions.

The gradient coils 3 are fed by the power supply unit 4. The RF transmitter coil 5 serves to generate RF magnetic fields and is connected to the RF transmitter and modulator 6. The transmitter coil 5 is connected to the signal amplifier and demodulator unit 10 via the transmitter-receiver circuit 9. Receiver elements 18, 19, positioned at their respective locations L1, L2 on the carrier 8, are arranged to detect a response of the object to the RF magnetic fields. The receiver elements 18, 19 may comprise a suitable RF-antenna susceptible to magnetic resonance signals, or a receiver coil, notably a phased-array coil, or a coil element. The control unit 11 controls the RF transmitter and modulator 6, the power supply unit 4 and selects suitable coils 18, 19 to detect the response of the object 7 to the magnetic resonance excitation.

In order to enable an automatic selection of the suitable receiver coil 18, 19 and/or suitable coil elements of the receiver coils 18, 19, the control unit 11 is arranged to calculate a position of the region of interest R on the carrier 8 and use the respective locations of the receiver coils L1, L2. The position of the anatomical area of interest either A1, or A2 with respect to the carrier is automatically determined using, for example an action of a light visor 20, which is arranged to define a reference point P on the object 7, whereby said reference point is indicative of the anatomical area of interest. The position of the reference point with respect to the carrier 8 is determined automatically by the functionality of commonly used built-in light visors. The dimension of the region of interest R is determined either automatically, for example by using a pre-stored imaging protocol defining the region of interest, by matching the acquired survey scan with an anatomical template, or by manually defining the region of interest using a suitable user interface 22. The manual delineation of the region of interest is in this case preferably enabled by a suitable graphics pointing device 25, like a computer mouse.

It must be understood that in the magnetic resonance apparatus several related frames of reference exist. First, the magnet and gradient system has its common frame of reference with an origin, generally referred to as the iso-center. The imaging indicator, usually implemented as light visor, has a position, which is known by design of the magnetic resonance apparatus and is fixed in the magnet frame of reference. Secondly, the carrier has its own frame of reference, whose position is calibrated with respect to the frame of reference of the magnet during an installation procedure of the magnetic resonance apparatus, so that a simple transformation can be used to translate an actual position of the carrier, as measured, for example by a suitable software, into the frame of reference of the magnet. Third, a receiver coil has its own frame of reference and its location with respect to the carrier, the position of the coil elements being usually related to the origin of the receiver coil. Several coil arrangements are envisaged, namely a fixed coil, whereby its position to the carrier is known by design, for example due to suitable coil fixation means present on the carrier, or, alternatively, a displaceable coil, whereby its position can be established using automatic positioning means comprising suitable mechanical measures and/or suitable wireless positioning technology. Fourth, a patient is usually assigned its own frame of reference, related, for example to the selected anatomical area conceived to be imaged by means of the magnetic resonance apparatus. The position of the anatomical area is selectable by a user, whereby the user links the patient frame of reference to the frame of reference of the magnet. Thus, the relation between the frame of reference of the magnet and the frame of reference of the carrier and the frame of reference of the patient relates to the actual location of the carrier, whereby the transformation between the frame of reference of the carrier and the frame of reference of the receiver coil further relates the patient frame of reference to the coil location. Fifth, there is a frame of reference for the imaging region of interest within the selected anatomical area, which is defined by a suitable user interface of the magnetic resonance apparatus, yielding, for example a graphic representation of the scan location with respect to a survey scan. The frame of reference of the region of interest is thus related to patient frame of reference. Thus, in order to select a suitable receiver coil a simple transformation between the known frames of references suffices, which can be solved using simple vector calculus. Spatial relations between different frames of reference of a magnetic resonance apparatus are illustrated with reference to FIG. 5.

Upon an event the dimension of the region of interest is established, the control unit 11 automatically calculates its position with respect to the carrier 8. After this, the control unit 11 addresses a look-up table 23, preferably stored in a suitable database D, said look-up table comprising respective dimensions of the receiver coils and respective locations L1, L2 of the receiver coils 18, 19 in the magnetic resonance imaging apparatus, notably on the carrier, or in the magnet bore. Preferably, for coil arrays the look-up table 23 comprises locations of respective coil elements within respective arrays, so that the coil elements may be individually selected. Alternatively, the locations of the receiver coils may be established in real-time using an automatic positioning module 40, which is explained in more detail with reference to FIG. 2. After this, the control unit 11 automatically determines which location of which receiver coils matches the position of the region of interest and selects the receiver coils accordingly. It is possible that the whole receiver coil is selected in this way, or a number of coil elements constituting a coil array. Preferably, the selection is being fed-back to the user on the user interface, whereby the selected coils C1, C2 are highlighted, for example on a survey scan. The non-selected coils are also presented using a different visualization method, for example as empty rectangles, or a dashed line. Still preferably, the user interface 22 is arranged to enable an adjustment of the automatic coils selection for the user. The adjustment may, for example be fulfilled using a suitable pointing device 25, like a computer mouse.

FIG. 2 presents in a schematic way an embodiment of the automatic positioning module according to the invention. The automatic positioning module 40 is arranged to automatically detect respective locations of the receiver coils 46, 48 on the carrier 42 and may be implemented in two different ways.

In its first embodiment, the automatic positioning module may comprise a plurality of electronic sockets 43a, 43b, 44a, 44b, 45a, 45b, which are arranged to interact with respective receiver coils 46, 46a, 46b, 47, for example by means of establishing respective electric connections. The sockets may have different dimension and may be located at different lateral positions on the carrier 42. Preferably, the location of each of the plurality of electric sockets on the carrier 42 is known. The sockets are connected to a logic unit 41 by means of respective wiring w1, w2, w3, w4, w5, w6, whereby the logic unit 41 is arranged to detect to which socket a receiver coil is connected. This feature may be implemented by measuring a change of an electric parameter of respective wiring, for example its electric impedance. Preferably, the sockets are arranged to automatically identify a type of the receiver coils being connected to it. This may be implemented by a provision of specific connectors within each sockets w1 . . . w6, said connectors being conceived to interact with a certain unique type of a connector of the receiver coil. Upon an event an electric connection between the socket and the receiver coil is established, the logic unit reports to the control unit 52 to which sockets 43a, 43b, 44a, 44b, 45a, 45b the receiver coils are connected. The control unit 52 addresses a look-up table 50 wherein respective locations of the sockets on the carrier 42 are stored. When the control unit 52 determines the position of the region of interest with respect to the carrier 42, as is explained with reference to FIG. 1, the automatic selection of the receiver coil is carried out based on the comparison between the locations of the available receiver coils and the position of the region of interest on the carrier 42. Alternatively, a receiver coil may comprise a posterior portion 46b, which may be arranged in the magnet bore. In this case the location of the posterior portion 47b is known by design and is stored in a suitable look-up table. Also, the look-up table stores the respective coordinates of the coil elements constituting the portion 46b. The position of the anterior portion 46a is established by the positioning module. The coil elements of such a coil are selected in accordance with geometric matching criteria, for example by comparing coordinates of respective coil elements of the anterior portion 46a and the posterior portion 46b. In this way it is allowable that the anterior and posterior portions are somewhat mutually displaced with respect to each other.

In its second embodiment, the automatic positioning module 40 is arranged to wirelessly determine the respective locations of the receiver coils on the carrier. For this purpose the automatic positioning module 40 comprises a set of coordinate transmitters t1, t2 . . . tN, preferably positioned on a housing of the magnetic resonance apparatus, or in a suitable vicinity thereto and being arranged to irradiate at least an imaging volume V of the magnetic resonance imaging apparatus. The receiver coils 46, 48 conceived to be positioned in the imaging volume V are provided with suitable further transmitters/receivers, for example respective beacons, 47, 49. The coordinate transmitters t1, t2, . . . tN are arranged to interact with the further transmitters/receivers and to determine a location of the transmitter/receiver on the carrier. The operation of the automatic positioning module according to the invention functions similarly to a global positioning system, however reduced to a finite space conformed to the area of the magnetic resonance apparatus, including the imaging volume. Preferably, the carrier 42 is provided with a transmitter/receiver 42t, arranged to determine a position of the carrier 42 in space. In case the carrier 42 is accommodated with a single transmitter/receiver, its position on the carrier 42 must be a-priori known and made available to the control unit 52. The wireless positioning module according to the invention operates as follows. When the receiver coil, for example 46 accommodated with the transmitter/receiver 47 is positioned on the carrier 42, the transmitters t1, . . . , tN detect a signal from the transmitter/receiver 47, for example a beacon and send a coordinate of the receiver coil 46 in space. The signal is then wirelessly sent to a wireless receiver WR, arranged to convert the received signal into an electric or optical signal and to make it available to the control unit 52. The coordinate of the carrier 42 in space is determined in a similar way. The control unit calculates the location of the receiver coil on the carrier 42 from these data, provided a position of the beacon 42t on the carrier is known. The selection of the suitable receiver coil is enabled from a comparison between the position of the region of interest with respect to the carrier 42 and the established location of the receiver coil on the carrier 42. Preferably, the automatic positioning module is actuatable on demand, so that when the location of the receiver coil on the carrier 42 is determined, the respective transmitters may be switched off in order not to disturb the environment of the magnetic resonance apparatus. Also in this case, a receiver coil may have a stationary portion 46b, whereby its location in the magnetic resonance imaging apparatus and the respective coordinates of the coil elements constituting the portion 46b are stored in a suitable file. The wireless positioning unit has to establish a location of the anterior portion 46a, which is supplied with a suitable beacon (not shown). The selection of the coil elements constituting the posterior coil 46b and the anterior coil 46a is carried out based on a comparison of coordinates of the respective coil elements.

It is noted that it is also possible to use receiver coils which are arranged to move with the carrier up to the field of view of the magnetic resonance apparatus, which is determined, for example by means of a suitable control software. In this case the location of the origin of the receiver coil with respect to the frame of reference of the magnetic resonance apparatus is known and is used for purposes of suitable selection of the coil elements. For example, when the control software determines that such receiver coil has reached the iso-center, while the region of interest is not fully covered, additional coils present on the patient are suitably identified and their respective dimensions and locations are established, after which the apparatus proceeds with selecting additional coil elements in accordance with their established dimensions and locations on the carrier.

FIG. 3 presents in a schematic way an embodiment of a user interface according to the invention. The user interface 54 is arranged to preferably comprise a plurality of interactive fields. First, the command fields 55a, 55b, 55c and 55d are provided. By way of example, the command field 55a is arranged to operate a suitable magnetic resonance imaging apparatus, whereby scan parameters are defined or are loaded from pre-saved scan templates. Additionally control buttons for, for example to start a MR-acquisition and to stop the MR-acquisition are provided. The control buttons are linked by means of suitable software codes to suitable computer program arranged to operate the magnetic resonance imaging apparatus is accordance with data defined in the control field 55*a*. The second control field, schematically represented by a window 55*b* is, for example arranged to access a suitable database of survey scans, or alternatively to access real-time data acquired in accordance with parameters defined in the first control window 55*a*. The third control field 55*c* is arranged, for example to define and/or to read out dynamic scan parameters, like type of the scanning protocol, measured voxel size, PNS levels and the like. The fourth control field 55*d* is arranged to control the operation of the user interface 54, whereby control buttons interfacing with graphics windows 54*a*, 54*b*, 54*c* are provided. The graphics window 54*a* by way of an example is arranged to visualize the selected scout image of the object under consideration, notably a patient. The user interface 54 is further arranged to communicate with the computer program according to the invention and to visualize the graphic representation of the receiver coil and/or receiver coil elements conceived to be used for purposes of data acquisition. In this way, the user interface 54 is arranged to show selected coil elements 56 in a suitable graphic representation, whereby not selected coil elements 57 are shown in a further suitable graphic representation for user's convenience. Although in this example line attributes are selected as a differentiator between the selected and non-selected coil elements, other graphic means are possible, like shadowing, coloring, etc. In case the user is satisfied with the result of the automatic coil selection, as is illustrated by 56, he may proceed with the data acquisition by actuating a suitable control button in a suitable control field, for example in the field 55*d*. Otherwise, the user may alter the selection of the coil elements by interacting with the graphic window 54*a*. For example, the user may deselect some coil elements, or he may add coil elements which were not originally selected. This step is preferably carried out using a suitable pointing device, like a computer mouse or the like. The result of the corresponding MR data acquisition is preferably shown in the graphic windows 54*b*, 54*c*, whereby scan results for different plane orientation is shown. Alternatively, one of the graphic windows 54*b*, 54*c* may be used to show a real-time reconstructed three-dimensional image of the region of interest. Still alternatively, one of the windows 54*b*, 54*c* may be used to show a matching image of the region of interest acquired using a different imaging modality, like an X-ray or CT-unit.

FIG. 4 presents in a schematic way a block-scheme 60 of an operation of the computer program according to the invention. The computer program according to the invention is arranged to cause a suitable processor (not shown) to carry out a step 62 of establishing respective locations of the plurality of receiver coils positioned on a carrier of the magnetic resonance imaging apparatus. This can be done by a sub-step 62*a* of addressing a suitable file (not shown), wherein respective pre-determined dwell locations of the receiver coils conceived to be used in the magnetic resonance imaging apparatus are stored, whereby geometric information on respective coil topologies is being stored, enabling a selection of individual coil elements within a given coil configuration. Alternatively, the computer program may carry out a sub-step 62*b*, wherein a real-time establishment of the respective locations of the receiver coils is carried out. Preferably, at step 62*b* the computer program controls the automatic positioning module (not shown), discussed with reference to FIG. 2, for acquisition and analysis of the transmitter/receiver signals representative of the locations of the receiver coils on the carrier. At step 64 the computer program controls a procedure of a definition of a reference point on an object conceived to be imaged, said reference point being indicative of the imaging region of interest. For this purpose, for example, at sub-step 64*a*, the computer program controls a light visor of the magnetic resonance imaging apparatus and reads out the corresponding position of the reference point on the carrier, said position being determined by an impingement of the light beam emanating from the light visor on the object. At step 66 a dimension of the region of interest is established with reference to the reference point. This step may be carried out in a fully automated fashion, for example by loading a pre-stored template of the region of interest, or by reading data corresponding to a delineation of the region of interest carried out by a suitable user. At step 68 the computer program calculates the position of the region of interest on the carrier from the position of the reference point and the dimension of the region of interest. At step 69 the computer program selects the receiver coil from the plurality of available receiver coils based on a comparison between the respective locations of said coils on the carrier and the position of the region of interest on the carrier. Preferably, at step 70 the computer program controls a suitable user interface for visualizing the selected receiver coils, for example presented as suitable graphic objects on an image of the object, for example a survey scan. At sub-step 72*a* the user may adjust the automatically determined selection by (de)selecting coils and/or coil elements. At step 74 the computer program sends a suitable control signal to activate the selected receiver coils to enable an acquisition of the response signals of the object in the region of interest.

FIG. 5 presents in a schematic way an overview of respective frames of reference in a magnetic resonance imaging apparatus 80. First, the magnet and gradient system 81 has its common frame of reference 82 (x1, y1, z1) with an origin O, generally referred to as the iso-center. The imaging indicator 84, usually implemented as light visor, has a position, which is known by design of the magnetic resonance apparatus and is fixed in the magnet frame of reference. An intersection of a light beam, emanating from the imaging indicator with the object conceived to be imaged, notably a patient, presents the reference point P. Secondly, the carrier 83 has its own frame of reference 86 (x2, y2, z2), whose position is calibrated with respect to the frame of reference 82 of the magnet 81 during an installation procedure of the magnetic resonance apparatus, so that a simple transformation can be used to translate an actual position of the carrier, as measured, for example by a suitable software 90, into the frame of reference of the magnet. The software 90 is, for example arranged to read-out respective signals of potentiometers coupled to a horizontal drive 85*a* and a vertical drive 85*b* of a table positioner 85. Third, a receiver coil being positioned on the carrier have their own reference frames. In FIG. 5 three respective receiver coils are shown 89*a*, 89*b*, 87*a*, 87*b*, 88*a*, whereby for clarity reasons only one receiver coil is depicted with a reference frame 87 (x3, y3, z3). Also, each receiver coil has its own origin, O1, O2, O3, respectively, which may be defined anywhere within the coil topology. Preferably, the position of the coil elements for respective coils are referenced to the respective origins O1, O2, O3 and are stored in a suitable look-up table (not shown). Several coil arrangements are envisaged, namely a fixed coil, whereby its position to the carrier is known by design, for example due to suitable coil fixation means present on the carrier, or, alternatively, a displaceable coil, whereby its position can be established using automatic positioning means comprising suitable mechanical measures and/or suitable wireless positioning technology. Also in this case it is possible that a displaceable posterior portion 87b is replaced by a posterior portion 87b', arranged in a magnet and being not displaceable. In this case its location is known and is stored in a look-up table together with coordinates of the coil elements constituting the portion 87b'. For such a coil topology, the location of a cooperating portion 87a is to be established upon which the respective coil elements are selected in accordance with suitable geometric matching criteria. Fourth, a patient is usually assigned its own frame of reference 88 (x4, y4, z4), related, for example to the selected anatomical area A1, or A2, or A3 conceived to be imaged by means of the magnetic resonance imaging apparatus. The position of the anatomical area is selectable by a user from a light visor action, when the patient is inserted into the imaging volume (not shown) of the magnetic resonance imaging apparatus, whereby the user links the patient frame of reference 88 to the frame of reference 82 of the magnet 81. Thus, the relation between the frame of reference of the magnet 82 and the frame of reference of the carrier 86 and the frame of reference of the patient 88 relates to the actual location of the carrier 83, whereby the transformation between the frame of reference of the carrier 86 and the frame of reference of the receiver coil 87 further relates the patient frame of reference 88 to the coil location. Fifth, there is a frame of reference 89 (x5, y5, z5) for the imaging region of interest R within the selected anatomical area, for example A1. Preferably, the region of interest R, 98 is defined by a suitable user interface 95 of the magnetic resonance apparatus, yielding, for example a graphic representation of the scan location 98 with respect to a survey scan 97. The frame of reference of the region of interest 89 is thus related to patient frame of reference 88. Thus, in order to select a suitable receiver coil a simple transformation between the known frames of references suffices, which can be solved using simple vector calculus. This operation is carried out by the control unit 100, which is preferably operated by the computer program 102, explained with reference to FIG. 4.

The invention claimed is:

1. A magnetic resonance imaging apparatus arranged to acquire a signal representative of a response of an object to an excitation pulse when said object is positioned in an imaging volume of the magnetic resonance imaging apparatus, whereby said apparatus is further arranged to automatically select a receiver element for purposes of said acquisition, said apparatus comprising:
    a carrier arranged to position the object in the imaging volume;
    a plurality of receiver elements arranged to cover respective regions on the object, said receiver elements having established respective dimensions and locations in the magnetic resonance imaging apparatus,
        whereby the magnetic resonance imaging apparatus further comprises:
    an imaging indicator arranged to define a position of a reference point for the object on the carrier, said reference point being indicative of a region of interest;
    an imaging localizer arranged to determine a position and a dimension of the region of interest with respect to the reference point;
    a control unit arranged to establish a further position and a further dimension of the region of interest on the carrier from the position of the reference point and said position and dimension of the region of interest and to select a receiver element from said plurality of receiver elements based on the further position and the further dimension of the region of interest and the respective dimensions and locations of the receiver elements in the magnetic resonance imaging apparatus.

2. An apparatus according to claim 1, wherein the apparatus further comprises automatic positioning module arranged to automatically establish the respective locations of the receiver elements and to forward a signal representative of said locations to the control unit.

3. An apparatus according to claim 1, further comprising a user interface arranged to visualize the selected receiver elements to a user.

4. An apparatus according to claim 3, wherein the user interface is further arranged to enable an adjustment of the automatic selection of the receiver element by the user.

5. A method for automatically selecting a receiver element in a magnetic resonance imaging apparatus, comprising the steps of:
    providing a carrier conceived to position an object to be imaged in an imaging volume of the apparatus;
    positioning a plurality of receiver elements on the object, said receiver elements having established respective dimensions and locations in the magnetic resonance imaging apparatus;
    defining a position of a reference point for the object on the carrier, said reference point being indicative of a region of interest;
    determining a position and a dimension of the region of interest with respect to the reference point;
    establishing a further a position and a further dimension of the region of interest on the carrier from the position of the reference point and said position and dimension of the region of interest;
    selecting a receiver element from said plurality of receiver elements based on the further position and the further dimension of the region of interest and the respective dimensions and locations of the receiver elements in the magnetic resonance imaging apparatus.

6. A method according to claim 5, wherein for establishing the location of the receiver elements on the carrier an automatic positioning module is used.

7. A method according to claim 5, wherein the method further comprises the steps of:
    visualizing the selected receiver elements to a user;
    enabling an adjustment of the automatic selection of the receiver element by the user.

8. A computer program for automatically selecting a receiver element from a plurality of receiver elements positioned on an object conceived to be imaged in a magnetic resonance apparatus, said computer program being arranged to cause the processor to carry out the steps of:
    establishing respective dimensions and locations of the plurality of receiver elements positioned in the magnetic resonance imaging apparatus;
    defining a position of a reference point for the object on the carrier, said reference point being indicative of a region of interest;
    determining a position and a dimension of the region of interest with respect to the reference point;
    establishing a further position and a further dimension of the region of interest on the carrier from the position of the reference point and said position and dimension of the region of interest;
    selecting a receiver element from said plurality of receiver elements based on the further position and the further dimension of the region of interest and the respective dimensions and locations of the receiver elements in the magnetic resonance imaging apparatus.

9. A computer program according to claim 8, further arranged to operate a user interface to visualize the selected receiver element to a user.

10. A computer program according to claim 9, further arranged to operate the user interface for enabling an adjustment of an automatic selection of the receiver element by the user.

* * * * *